(12) United States Patent
Liu et al.

(10) Patent No.: US 9,966,400 B2
(45) Date of Patent: May 8, 2018

(54) PHOTOSENSITIVE MODULE AND METHOD FOR FORMING THE SAME

(71) Applicant: XINTEC INC., Taoyuan (TW)

(72) Inventors: Tsang-Yu Liu, Zhubei (TW); Chi-Chang Liao, Zhubei (TW)

(73) Assignee: XINTEC INC., Taoyuan (TW)

( * ) Notice: Subject to any disclaimer, the term of this patent is extended or adjusted under 35 U.S.C. 154(b) by 0 days. days.

(21) Appl. No.: 15/005,956

(22) Filed: Jan. 25, 2016

(65) Prior Publication Data

US 2016/0218129 A1    Jul. 28, 2016

Related U.S. Application Data

(60) Provisional application No. 62/108,810, filed on Jan. 28, 2015.

(51) Int. Cl.
*H01L 27/146* (2006.01)

(52) U.S. Cl.
CPC .. *H01L 27/14618* (2013.01); *H01L 27/14625* (2013.01); *H01L 27/14636* (2013.01); *H01L 27/14685* (2013.01); *H01L 27/14687* (2013.01); *H01L 2224/13* (2013.01)

(58) Field of Classification Search
CPC ....... H01L 27/14618; H01L 27/146625; H01L 27/14685; H01L 27/14687
See application file for complete search history.

(56) References Cited

U.S. PATENT DOCUMENTS

| | | | |
|---|---|---|---|
| 6,627,953 B1 * | 9/2003 | Vu | A61B 3/113 257/347 |
| 8,502,380 B2 * | 8/2013 | Liu | H01L 24/03 257/738 |
| 2008/0188030 A1 | 8/2008 | Kang | |

FOREIGN PATENT DOCUMENTS

| | | |
|---|---|---|
| CN | 102610624 | 7/2012 |
| TW | 201304127 | 1/2013 |

\* cited by examiner

*Primary Examiner* — Long Pham
(74) *Attorney, Agent, or Firm* — Liu & Liu (57) ABSTRACT

A method for forming a photosensitive module is provided. The method includes providing a sensing device. The sensing device includes a substrate having a first surface and a second surface opposite thereto. A conducting pad is located on the first surface. A first opening penetrates the substrate and exposes the conducting pad. A redistribution layer is in the first opening to electrically connect to the conducting pad. A cover plate is located on the first surface and covers the conducting pad. The method also includes bonding the sensing device to a circuit board. The cover plate is removed after bonding the sensing device to the circuit board. The method further includes mounting an optical component corresponding to the sensing device on the circuit board. A photosensitive module formed by the method is also provided.

20 Claims, 9 Drawing Sheets

PHOTOSENSITIVE MODULE AND METHOD FOR FORMING THE SAME

CROSS REFERENCE TO RELATED APPLICATIONS

This Application claims priority of U.S. Provisional Application No. 62/108,810, filed Jan. 28, 2015, the entirety of which is incorporated by reference herein.

BACKGROUND OF THE INVENTION

Field of the Invention

The invention relates to a photosensitive module and methods for forming the same, and in particular to a photosensitive module with a sensing device formed by a wafer-level packaging process.

Description of the Related Art

A camera module is usually fabricated by chip on board (COB) technology. For example, a die is directly attached onto a printed circuit board (PCB) by adhesive glue. The die is electrically connected to the PCB by wire bonding processes. Next, a lens and a holder are mounted on the PCB.

However, it is necessary to press the die in order for it to be successfully attached to the PCB, using COB technology. As a result, it is difficult to reduce the thickness of the die. Otherwise, physical damage may be incurred. Furthermore, performing wire bonding processes to construct an electrically conductive path is necessary with COB technology. The aforementioned fabrication process needs to be carried out in a clean environment, such as a clean room, to ensure the quality and yield of the camera modules. Accordingly, the fabrication cost is high.

Thus, there exists a need to develop a novel photosensitive module and methods for forming the same, capable of mitigating or eliminating the aforementioned problems.

BRIEF SUMMARY OF THE INVENTION

An embodiment of the invention provides a method for forming a photosensitive module. The method comprises providing a sensing device. The sensing device comprises a substrate having a first surface and a second surface opposite thereto. The sensing device also comprises a conducting pad located on the first surface. The sensing device further comprises a first opening penetrating the substrate and exposing the conducting pad. In addition, the sensing device comprises a redistribution layer formed in the first opening to electrically connect the conducting pad. The sensing device also comprises a cover plate on the first surface and covering the conducting pad. The method also comprises bonding the sensing device to a circuit board. The method further comprises removing the cover plate of the sensing device after bonding the sensing device to the circuit board. In addition, the method comprises mounting an optical component corresponding to the sensing device on the circuit board.

An embodiment of the invention provides a photosensitive module. The photosensitive module comprises a sensing device bonded onto a circuit board. The sensing device comprises a substrate having a first surface and a second surface opposite thereto. The sensing device also comprises a conducting pad on the first surface. The sensing device further comprises a first opening penetrating the substrate and exposing the conducting pad. In addition, the sensing device comprises a redistribution layer disposed in the first opening and electrically connected to the conducting pad. The photosensitive module also comprises an optical component corresponding to the sensing device and mounted on the circuit board.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The making and using of the embodiments of the present disclosure are discussed in detail below. However, it should be noted that the embodiments provide many applicable inventive concepts that can be embodied in a variety of specific methods. The specific embodiments discussed are merely illustrative of specific methods to make and use the embodiments, and do not limit the scope of the disclosure. The disclosed contents of the present disclosure include all the embodiments derived from claims of the present disclosure by those skilled in the art. In addition, the present disclosure may repeat reference numbers and/or letters in the various embodiments. This repetition is for the purpose of simplicity and clarity, and does not imply any relationship between the different embodiments and/or configurations discussed. Furthermore, when a first layer is referred to as being on or overlying a second layer, the first layer may be in direct contact with the second layer, or spaced apart from the second layer by one or more material layers.

A chip package according to an embodiment of the present invention may be used to package micro-electro-mechanical system chips. However, embodiments of the invention are not limited thereto. For example, the chip package of the embodiments of the invention may be implemented to package active or passive devices or electronic components of integrated circuits, such as digital or analog circuits. For example, the chip package is related to optoelectronic devices, micro-electro-mechanical systems (MEMS), biometric devices, microfluidic systems, and physical sensors measuring changes to physical quantities such as heat, light, capacitance, pressure, and so on. In particular, a wafer-level package (WSP) process may optionally be used to package semiconductor chips, such as image-sensor elements, light-emitting diodes (LEDs), solar cells, RF circuits, accelerators, gyroscopes, fingerprint-recognition devices, microactuators, surface acoustic wave devices, pressure sensors, ink printer heads, and so on.

The aforementioned wafer-level packaging process mainly means that after the packaging step is accomplished during the wafer stage, the wafer with chips is cut to obtain individual packages. However, in a specific embodiment, separated semiconductor chips may be redistributed on a carrier wafer and then packaged, which may also be referred to as a wafer-level packaging process. In addition, the aforementioned wafer-level packaging process may also be adapted to form a chip package having multilayer integrated circuit devices by stacking a plurality of wafers having integrated circuits or to form a system-in-package (SIP).

Figure 1A:
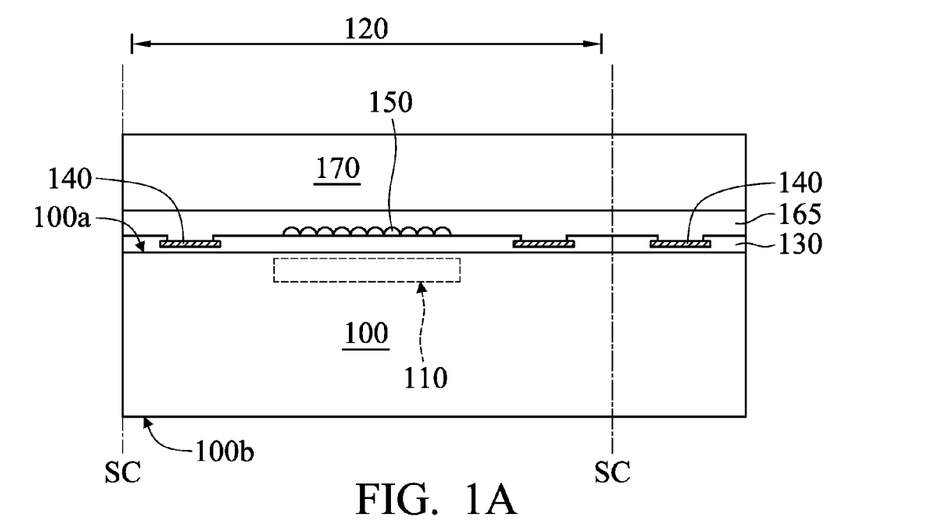
FIGS. 1A to 1F are cross-sectional views of an exemplary embodiment of a method for forming a photosensitive module according to the invention.
Figure 1B:
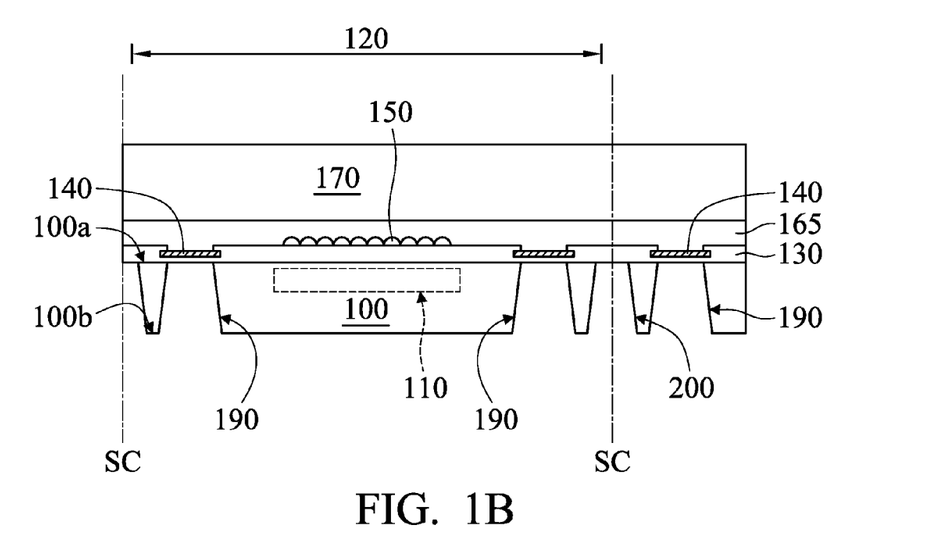
Figure 1C:
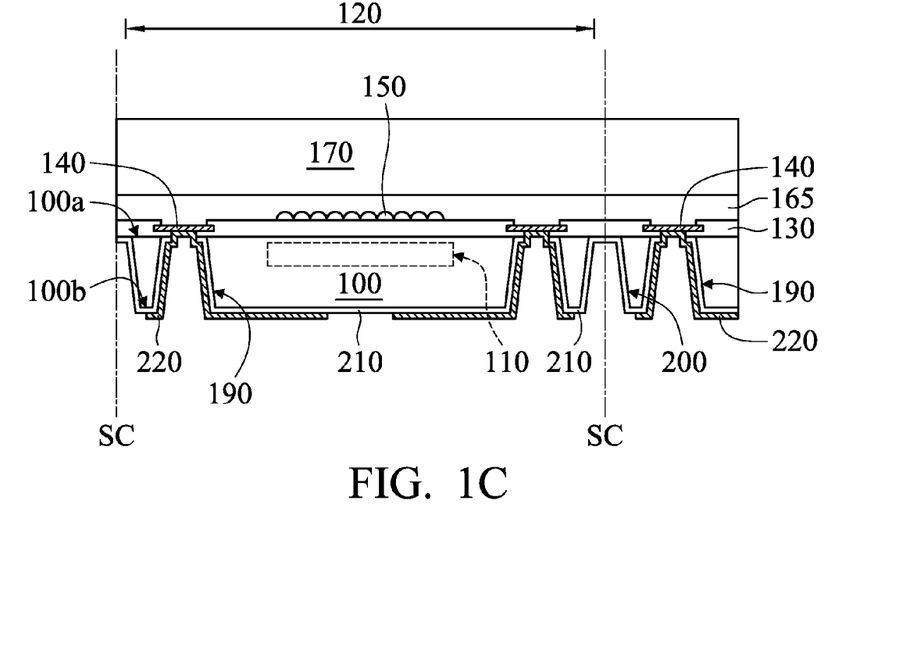
Figure 1D:
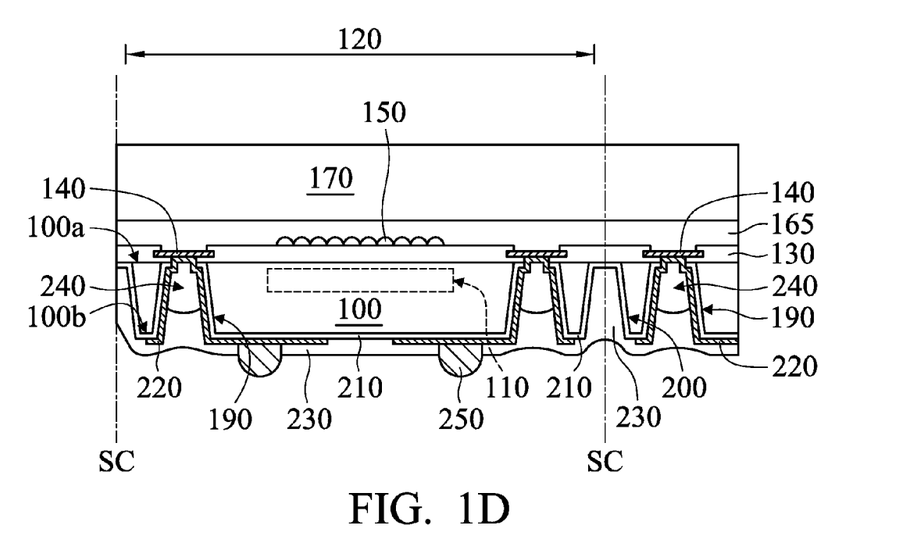
Figure 1E:
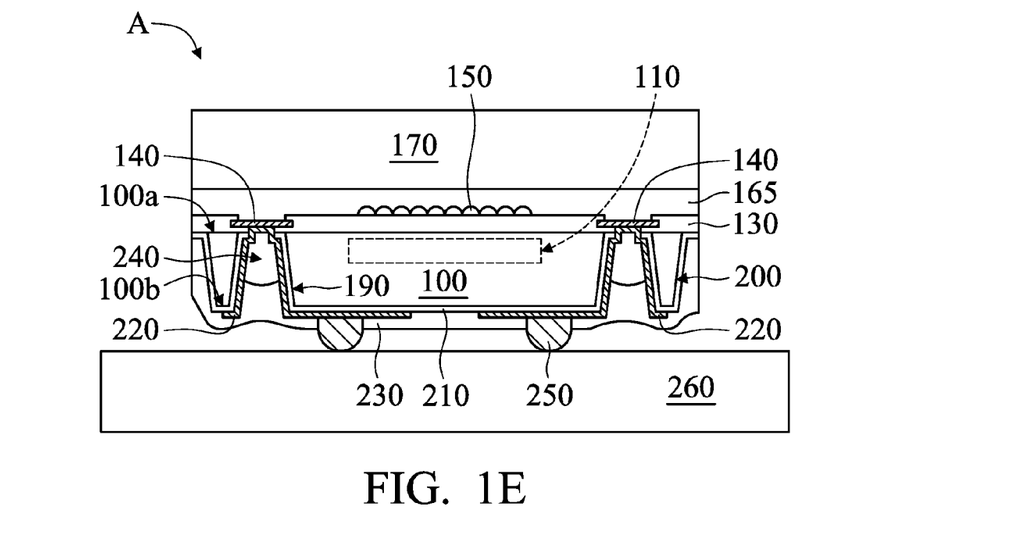
Figure 1F:
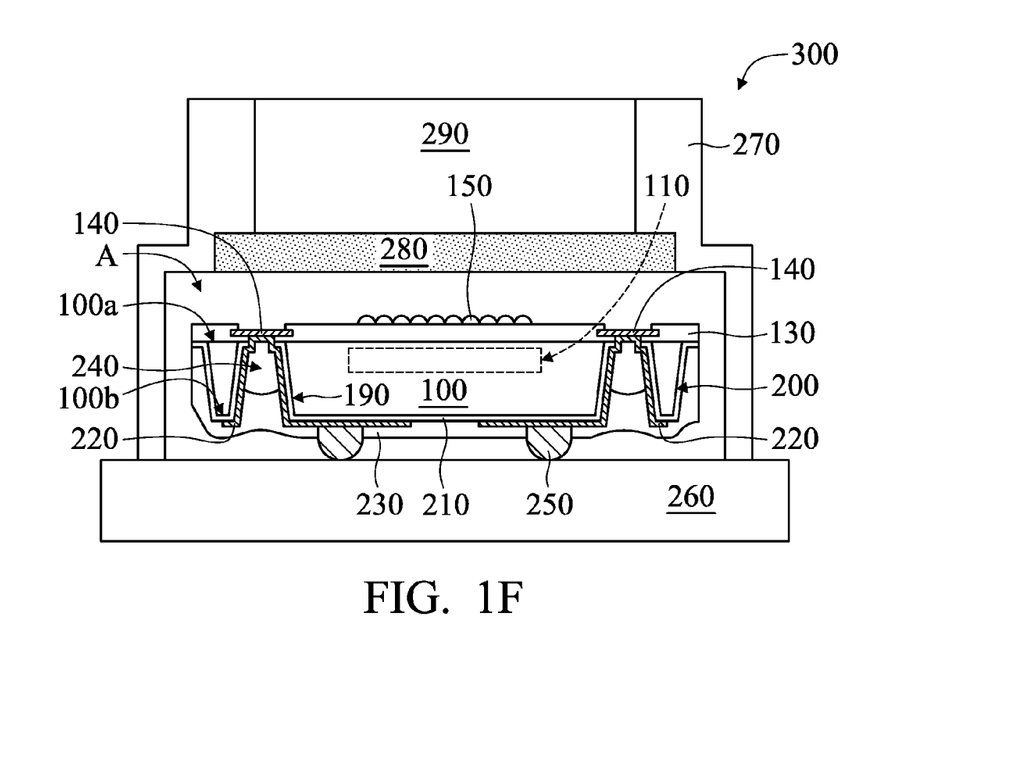

Referring to FIG. 1F, a cross-sectional view of an exemplary embodiment of a photosensitive module 300 according to the invention is illustrated. The photosensitive module 300 comprises a circuit board 260, a sensing device A and an optical component. In some embodiments, the sensing device A comprises a substrate 100, conducting pads 140, first openings 190 and a redistribution layer (RDL) 220. The substrate 100 has a first surface 100a and a second surface 100b opposite thereto. In some embodiments, the substrate 100 may be a silicon substrate or another semiconductor substrate.

There is an insulating layer 130 on the first surface 100a of the substrate 100. In general, the insulating layer 130 may be made of an interlayer dielectric (ILD) layer, inter-metal dielectric (IMD) layers and a covering passivation layer. To simplify the diagram, only a single insulating layer 130 is depicted herein. In other words, the sensing device A comprises a chip/die, and the chip/die comprises the substrate 100 and the insulating layer 130. In some embodiments, the insulating layer 130 may comprise an inorganic material, such as silicon oxide, silicon nitride, silicon oxynitride, metal oxide, another suitable insulating material or a combination thereof.

In some embodiments, one or more conducting pads 140 are in the insulating layer 130 on the first surface 100a of the substrate 100. In some embodiments, the conducting pads 140 may be a single conducting layer or comprise multiple conducting layers. To simplify the diagram, only two conducting pads 140 comprising a single conducting layer in the insulating layer 130 are depicted herein as an example. In some embodiments, the insulating layer 130 comprises one or more openings exposing the corresponding conducting pads 140.

In some embodiments, the sensing device A further comprises a sensing or device region 110 and an optical element 150. The sensing or device region 110 may be adjacent to the first surface 100a of the substrate 100, and may be electrically connected to the conducting pads 140 through interconnection structures (not shown). The sensing or device region 110 may comprise an image sensing element. For example, the sensing device may be a complementary metal oxide semiconductor (CMOS) image sensing device or another suitable image sensing device.

Furthermore, the optical element 150 is disposed on the first surface 100a of the substrate 100 and corresponds to the sensing or device region 110. In some embodiments, the optical element 150 may be a micro-lens array or another suitable optical element used for an image sensing device.

A spacer layer (or dam) 160 is disposed on the first surface 100a of the substrate 100, and covers the conducting pads 140. Moreover, the spacer layer 160 has a cavity 180 surrounding the optical element 150 so that the optical element 150 is in the cavity 180. In some embodiments, the spacer layer 160 does not substantially absorb moisture. In some embodiments, the spacer layer 160 may itself be adhesive and may contact none of the adhesion glue, thereby assuring that the spacer layer 160 will not move due to the disposition of the adhesion glue. Furthermore, since adhesion glue is not needed, the sensing device can be prevented from being contaminated by an overflow of the adhesion glue. In some other embodiments, the spacer layer 160 may be non-adhesive, and there may be an adhesive layer between the spacer layer 160 and the insulating layer 130.

In some embodiments, the spacer layer 160 may comprise epoxy resin, inorganic materials (such as silicon oxide, silicon nitride, silicon oxynitride, metal oxide or a combination thereof), organic polymer materials (such as polyimide, butylcyclobutene (BCB), parylene, polynaphthalenes, fluorocarbons or acrylates), a photoresist material or another suitable insulating material.

The first openings 190 penetrate the substrate 100 and extend into the insulating layer 130, thereby exposing the corresponding conducting pads 140 from the second surface 100b of the substrate 100. In some embodiments, the sensing device A further comprises a second opening 200, which extends along the sidewall of the substrate 100 and penetrates the substrate 100.

An insulating layer 210 is disposed on the second surface 100b of the substrate 100. The insulating layer 210 conformally extends to the sidewalls and the bottoms of the first opening 190 and the second opening 200, and exposes the conducting pads 140. In some embodiments, the insulating layer 210 may comprise epoxy resin, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates) or another suitable insulating material.

The patterned redistribution layer 220 is disposed on the second surface 100b of the substrate 100. The redistribution layer 220 conformally extends to the sidewalls and the bottom of the first opening 190 without extending into the second opening 200. The redistribution layer 220 may be electrically isolated from the substrate 100 by the insulating layer 210. The redistribution layer 220 may be in direct electrical contact with or indirectly electrically connected to the exposed conducting pads 140 through the first openings 190. As a result, the redistribution layer 220 in the first openings 190 is also referred to as a through silicon via (TSV). In some embodiments, the redistribution layer 220 may comprise aluminum, copper, gold, platinum, nickel, tin, a combination thereof, a conductive polymer material, a conductive ceramic material (such as indium tin oxide or indium zinc oxide), or another suitable conductive material.

A protection layer 230 is disposed on the second surface 100b of the substrate 100, and fills the first openings 190 and the second opening 200 so as to cover the redistribution layer 220. In some embodiments, the protection layer 230 has an uneven surface. In some embodiments, the protection layer 230 may comprise epoxy resin, solder mask, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates), or another suitable insulating material.

In some embodiments, the first openings 190 are not completely filled with the protection layer 230, so that a hole 240 is formed between the redistribution layer 220 and the protection layer 230 within the first openings 190. Since the protection layer 230 partially fills the first openings 190 and leaves the hole 240, the hole 240 can be a buffer between the redistribution layer 220 and the protection layer 230 in thermal cycles induced in subsequent processes. Undesirable stress, which is induced between the redistribution layer 220 and the protection layer 230 as a result of mismatch of thermal expansion coefficients, is reduced. The redistribution layer 220 is prevented from being excessively pulled by the protection layer 230 when the external temperature or pressure dramatically changes. As a result, peeling or disconnection problems of the redistribution layer 220, which is close to the conducting pad structure, are avoidable. In some embodiments, the interface between the protection layer 230 and the hole 240 has an arcuate contour.

The protection layer 230 on the second surface 100b of the substrate 100 has openings exposing portions of the redistribution layer 220. Furthermore, multiple conducting structures 250 (such as solder balls, bumps or conductive pillars) are disposed in the openings of the protection layer 230 to electrically connect to the exposed redistribution layer 220. In some embodiments, the conducting structures 250 may comprise tin, lead, copper, gold, nickel, or a combination thereof.

In some embodiments, the sensing device A is bonded to the circuit board 260, and is electrically connected to the circuit board 260 through the conducting structures 250 on the second surface 100b of the substrate 100. Furthermore, an optical component of the photosensitive module 300 corresponds to the sensing device A and is mounted on the circuit board 260. As a result, the spacer layer 160 is located between the optical component and the first surface 100a of the substrate 100. The conducting pads 140 of the sensing device A are exposed and face the optical component. In some embodiments, there is only an air gap sandwiched between a portion of the conducting pads 140 and the optical component. In other words, there is no layer (such as an insulating material layer) between the conducting pads 140 and the optical component. In other embodiments, the sensing device A may optionally comprise a light-transmissive cover plate located between the optical component and the spacer layer 160 on the substrate 100 so as to protect the optical element 150.

In some embodiments, the optical component comprises a holder 270, a filter 280 and a lens 290. The holder 270 comprises containing space or room, so that the filter 280 and the lens 290 are disposed within the space of the holder 270 and are fixed to the holder 270. Therefore, the photosensitive module 300 is a fixed-focus device.

The capacity of the holder 270 is such that there is enough space to further accommodate the sensing device A on the circuit board 260. As a result, the conducting pads 140 of the sensing device A are in direct contact with the space of the holder 270. In some embodiments, the filter 280 in the space of the holder 270 is located between the lens 290 and the sensing device A so as to filter out infrared irradiation in light, which irradiates through the lens 290 towards the sensing device A. In some embodiments, the filter 280 is made of a light-transmissive material (such as glass) and a filter layer thereon. Furthermore, the lens 290 can be formed of a single lens set or comprise multiple lens sets. To simplify the diagram, only a flat filter 280 and a flat lens 290 are depicted herein. The structure of the optical component is determined by design requirements and is not limited thereto.

Figure 3A:
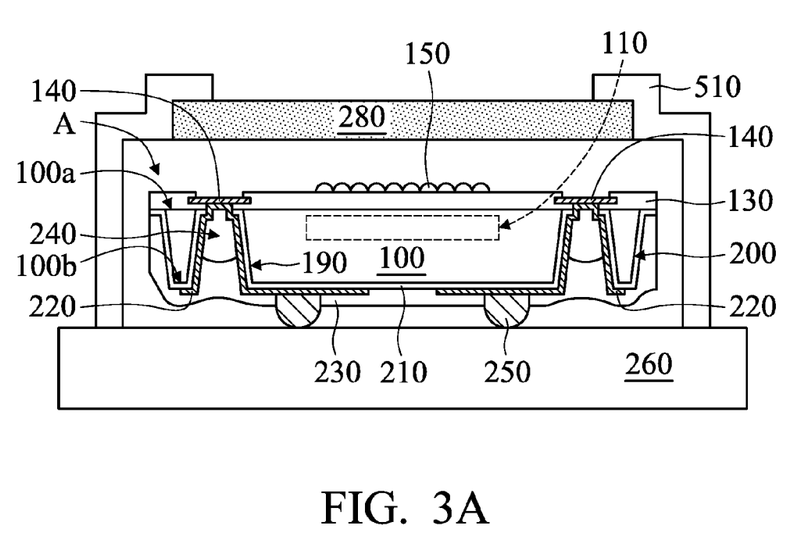
FIGS. 3A to 3B are cross-sectional views of yet another exemplary embodiment of a method for forming a photosensitive module according to the invention.
Figure 3B:
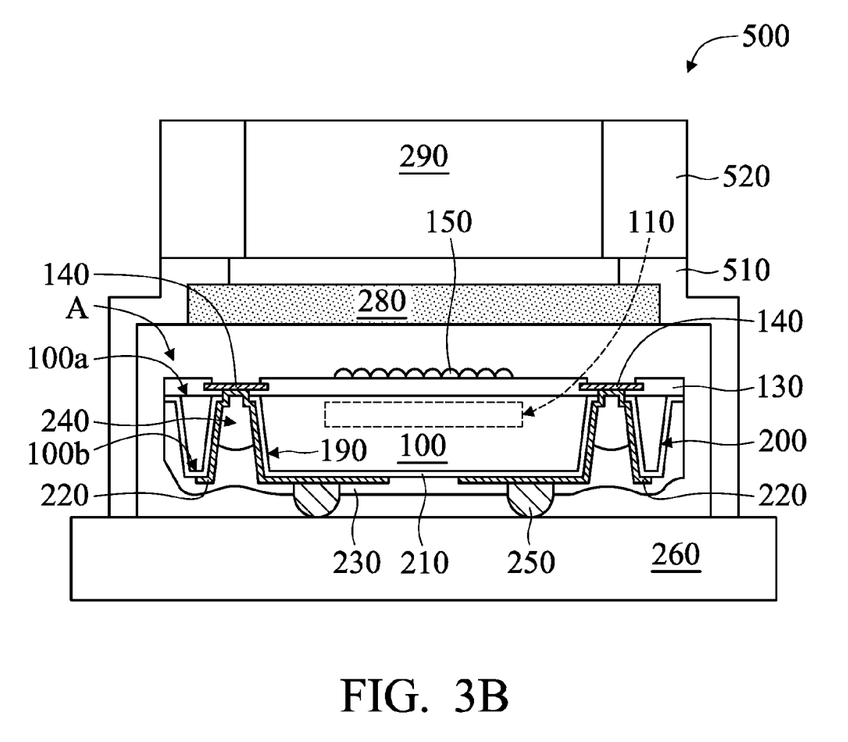
Figure 4:
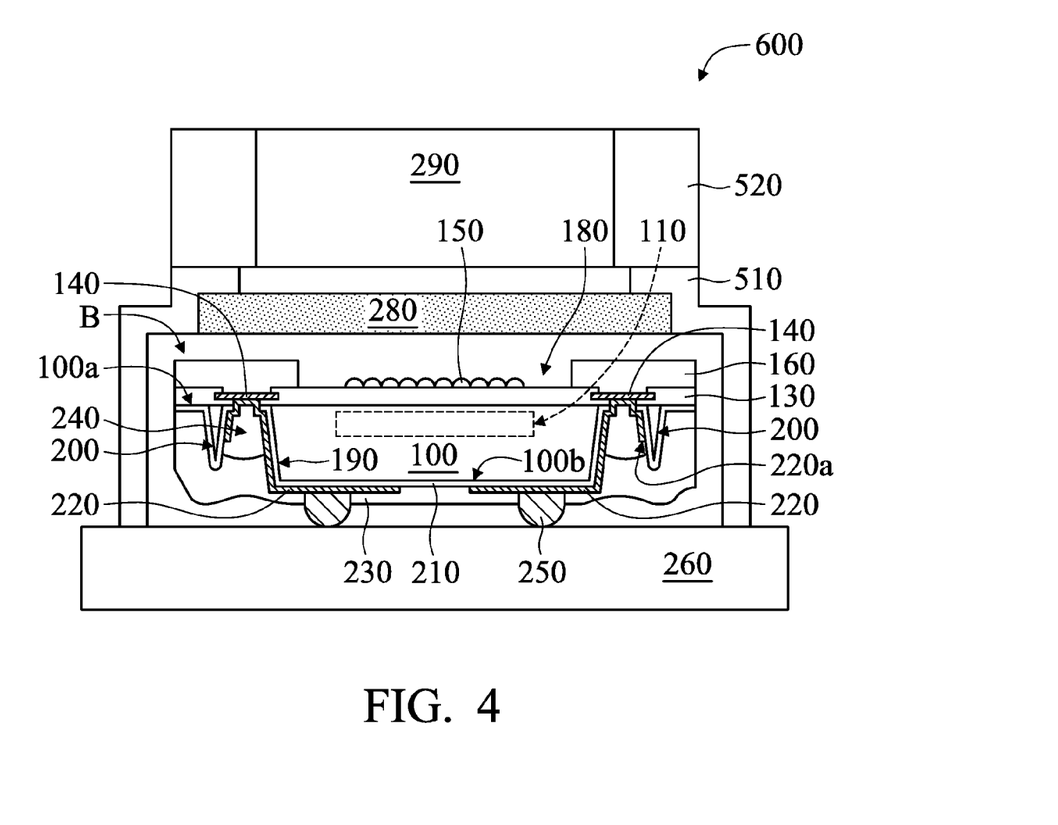
FIG. 4 is a cross-sectional view of other exemplary embodiments of a photosensitive module according to the invention.

Referring to FIGS. 3B and 4, cross-sectional views of other exemplary embodiments of photosensitive modules 500 and 600, respectively, are illustrated according to the invention. Elements in FIGS. 3B, and 4 that are the same as those in FIG. 1F are labeled with the same reference numbers as in FIGS. 3B, and 4 and are not described again for brevity.

The structure of the photosensitive module 500 shown in FIG. 3B is similar to that of the photosensitive module 300 shown in FIG. 1F. Both the photosensitive modules 300 and 500 comprise the sensing device A with exposed conducting pads 140. However, the difference between them is that the photosensitive module 300 is a fixed-focus device while the photosensitive module 500 is a zoom (variable focus) device.

For example, the optical component in the photosensitive module 500 comprises underlying bracket 510 and filter 280 and overlying actuator 520 and lens 290. The bracket 510 comprises containing space or room, such that the filter 280 is disposed within the space of the bracket 510 and is fixed to the bracket 510. The capacity of the bracket 510 is such that there is enough space to further accommodate the sensing device A on the circuit board 260. As a result, the filter 280 is located between the lens 290 and the sensing device A so as to filter out infrared irradiation.

In some embodiments, the actuator 520 may comprise a voice coil motor, an ultrasonic motor, a stepping motor, or another suitable actuator. The lens 290 is actuated to move in a direction that is away from or toward the sensing device A, so that the photosensitive module 500 has automatic zoom functions. To simplify the diagram, only a flat filter 280, a flat lens 290 and a flat actuator 520 are depicted herein. The structure of the optical component is determined by design requirements and is not limited thereto.

The structure of the photosensitive module 600 shown in FIG. 4 is similar to that of the photosensitive module 500 shown in FIG. 3B. One of the differences therebetween is that the photosensitive module 500 comprises the sensing device A with exposed conducting pads 140 while the photosensitive module 600 comprises a sensing device B with the conducting pads 140 covered by the spacer layer 160 disposed on the first surface 100a of the substrate 100.

Moreover, the differences between the photosensitive modules 500 and 600 also comprise that the first opening 190 and the second opening 200 in the sensing device B are in communication with each other, such that the substrate 100 has a sidewall portion that is lower than the second surface 100b. In other words, the thickness of the sidewall portion is less than the thickness of the substrate 100. Moreover, an end 220a of the redistribution layer 220 extends only to the sidewall of the first opening 190, rather than extending on the second surface 100b of the substrate 100. For example, the end 220a of the redistribution layer 220 is located within the hole 240. In some embodiments, the sidewalls of the first opening 190 and the second opening 200 are inclined to the first surface 100a of the substrate 100.

It should be noted that the embodiment of FIG. 4 can be implemented to the embodiments of FIG. 1F. For example, in some embodiments, the photosensitive module 600 may comprise a similar optical component to that in the photosensitive module 300. As a result, the photosensitive module 600 with the sensing device B becomes a zoom device. In some other embodiments, the sensing device B may not comprise the spacer layer 160. As a result, the conducting pads 140 are exposed and directly face the optical component.

Embodiments of the invention replace a conventional die by a chip package to serve as a sensing device in a photosensitive module. In the aforementioned embodiments, the photosensitive modules 300, 400, 500, and 600 comprise a front-side illumination (FSI) sensing device. However, in other embodiments, the photosensitive modules 300, 400, 500, and 600 may comprise a back-side illumination (BSI) sensing device.

An exemplary embodiment of a method for forming a photosensitive module according to the invention is illustrated in FIGS. 1A to 1F, in which FIGS. 1A to 1F are cross-sectional views of an exemplary embodiment of a method for forming a photosensitive module 300 according to the invention.

Referring to FIG. 1A, a substrate 100 is provided. The substrate 100 has a first surface 100a and a second surface 100b opposite thereto, and comprises multiple chip regions 120. To simplify the diagram, only a complete chip region and a partial chip region adjacent thereto are depicted herein. In some embodiments, the substrate 100 may be a silicon substrate or another semiconductor substrate. In some other embodiments, the substrate 100 may be a silicon wafer so as to facilitate the wafer-level packaging process.

There is an insulating layer 130 on the first surface 100a of the substrate 100. In general, the insulating layer 130 may be made of an ILD layer, IMD layers and a covering passivation layer. To simplify the diagram, only a single insulating layer 130 is depicted herein. In some embodiments, the insulating layer 130 may comprise an inorganic material, such as silicon oxide, silicon nitride, silicon oxynitride, metal oxide, a combination thereof, or another suitable insulating material.

In some embodiments, one or more conducting pads 140 are located in the insulating layer 130 in each of the chip regions 120. In some embodiments, the conducting pads 140 may be a single conducting layer or comprise multiple conducting layers. To simplify the diagram, only two conducting pads 140 comprising a single conducting layer in the insulating layer 130 are depicted herein as an example. In some embodiments, the insulating layer 130 in each of the chip regions 120 comprises one or more openings exposing the corresponding conducting pads 140 so as to perform a pre-test through the exposed conducting pads 140.

In some embodiments, a sensing or device region 110 is located in each of the chip regions 120. The sensing or device region 110 may be adjacent to the first surface 100a of the substrate 100, and may be electrically connected to the conducting pads 140 through interconnection structures (not shown). Moreover, the sensing or device region 110 may comprise an image sensing element.

In some embodiments, the aforementioned structure may be fabricated by sequentially performing a front-end process and a back-end process of a semiconductor device. For example, the sensing or device region 110 and integrated circuits may be formed in the substrate 100 during the front-end process. The insulating layer 130, the interconnection structures, and the conducting pads 140 may be formed on the substrate 100 during the back-end process. In other words, the following method for forming a chip package or a sensing device proceeds subsequently packaging processes to the substrate after the back-end process is completed.

In some embodiments, each of the chip regions 120 comprises an optical element 150 disposed on the first surface 100a of the substrate 100 and corresponding to the sensing or device region 110. In some embodiments, the optical element 150 may be a micro-lens array or another suitable optical element used for an image sensing device.

Afterwards, a cover plate 170 is bonded to the substrate 100 by a temporary adhesive layer 165 (such as a removable tape). The cover plate 170 is used to provide support and protection. In some embodiments, the cover plate 170 may comprise glass or another suitable substrate material. The temporary adhesive layer 165 formed between the cover plate 170 and the substrate 100 completely covers the first surface 100a of the substrate 100. For example, the temporary adhesive layer 165 covers the conducting pads 140, the sensing or device region 110, and the optical element 150.

Referring to FIG. 1B, a thinning process (such as an etching process, a milling process, a grinding process or a polishing process) using the cover plate 170 as a carrier substrate is performed on the second surface 100b of the substrate 100. As a result, the thickness of the substrate 100 is reduced. For example, the thickness of the substrate 100 may be less than about 100 μm.

Afterwards, multiple first openings 190 and a second opening 200 may be simultaneously formed in the substrate 100 in each of the chip regions 120 by a lithography process and an etching process (such as a dry etching process, a wet etching process, a plasma etching process, a reactive ion etching process, or another suitable process). The first openings 190 and the second opening 200 expose the insulating layer 130 from the second surface 100b of the substrate 100. In other embodiments, the first openings 190 and the second opening 200 may be respectively formed by a notching process, and lithography and etching processes.

In some embodiments, the first openings 190 correspond to the conducting pads 140 and penetrate the substrate 100. Moreover, the second opening 200 extends along scribed lines SC between the adjacent chip regions 120 and penetrates the substrate 100. As a result, portions of the substrate 100 in the chip regions 120 are separated from each other.

Referring to FIG. 1C, an insulating layer 210 may be formed on the second surface 100b of the substrate 100 by a deposition process (such as a coating process, a physical vapor deposition process, a chemical vapor deposition process or another suitable process). The insulating layer 210 fills the first openings 190 and the second opening 200, and is conformally deposited on the sidewalls and the bottoms of the first openings 190 and the second opening 200. In some embodiments, the insulating layer 210 may comprise epoxy resin, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates) or another suitable insulating material.

Afterwards, portions of the insulating layer 210 on the bottom of the first openings 190 and the underlying insulating layer 130 are removed by lithography and etching processes. As a result, the first openings 190 further extend into the insulating layer 130 and expose the corresponding conducting pads 140.

A patterned redistribution layer 220 is formed on the insulating layer 210 by a deposition process (such as a coating process, a physical vapor deposition process, a chemical vapor deposition process, an electroplating process, an electroless plating process or another suitable process) and lithography and etching processes. The redistribution layer 220 conformally extends to the sidewalls and the bottoms of the first openings 190 without extending into the second opening 200.

The redistribution layer 220 is electrically isolated from the substrate 100 by the insulating layer 210. The redistribution layer 220 may be in direct electrical contact with or indirectly electrically connected to the exposed conducting pads 140 through the first openings 190. As a result, the redistribution layer 220 in the first openings 190 is also referred to as a TSV. In some embodiments, the redistribution layer 220 may comprise aluminum, copper, gold, platinum, nickel, tin, a combination thereof, a conductive polymer material, a conductive ceramic material (such as indium tin oxide or indium zinc oxide), or another suitable conductive material.

Referring to FIG. 1D, a protection layer 230 may be formed on the second surface 100b of the substrate 100 by a deposition process. The protection layer 230 fills the first openings 190 and the second opening 200 to cover the redistribution layer 220. In some embodiments, the protection layer 230 may comprise epoxy resin, solder mask, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates), or another suitable insulating material.

In some embodiments, the first openings 190 are not completely filled with the protection layer 230, so that a hole 240 is formed between the redistribution layer 220 and the protection layer 230 within the first openings 190. In some embodiments, the interface between the protection layer 230 and the hole 240 has an arcuate contour. In other embodiments, the first openings 190 may be completely filled with the protection layer 230.

Next, openings may be formed in the protection layer 230 on the second surface 100b of the substrate 100 by lithography and etching processes so as to expose portions of the redistribution layer 220. Subsequently, conducting structures 250 (such as solder balls, bumps or conductive pillars) may be filled in the openings of the protection layer 230 by a electroplating process, a screen printing process or another suitable process to electrically connect to the exposed redistribution layer 220. In some embodiments, the conducting structures 250 may comprise tin, lead, copper, gold, nickel, or a combination thereof.

Afterwards, the insulating layers 130 and 210, the protection layer 230, the temporary adhesive layer 165 and the cover plate 170 are diced along the scribed lines SC (equivalent to along the second opening 200), thereby forming multiple separated chip packages (i.e., sensing devices A).

In some embodiments, the first openings 190 and the second opening 200 of the sensing devices A are spaced apart and completely isolated from each other through a portion of the substrate 100 (such as a sidewall portion). The subsequently formed redistribution layer 220 extends on the second surface 100b between the first openings 190 and the second opening 200. In other embodiments, the first openings 190 and the second opening 200 of a sensing device B as shown in FIG. 4 are in communication with each other. As a result, the end 220a of the redistribution layer 220 extends to the sidewall of the first opening 190, rather than extending on the second surface 100b of the substrate 100. For example, the end 220a of the redistribution layer 220 is located within the hole 240 in the first opening 190.

Referring to FIG. 1E, the sensing device A is bonded onto a circuit board 260. The sensing device A is electrically connected to the circuit board 260 through the conducting structures 250 on the second surface 100b of the substrate 100. For example, the conducting structures 250 may be formed of solder.

After the sensing device A is placed on the circuit board 260, a reflow process may be performed to bond the sensing device A to the circuit board 260 through solder balls. Furthermore, before or after the sensing device A is bonded onto the circuit board 260, the required passive elements (such as inductors, capacitors, resistors or other electronic elements) may be formed on the circuit board 260 by surface mount technology (SMT). In addition, the sensing device A and the aforementioned passive elements may be simultaneously bonded onto the circuit board 260 by the same reflow process.

Referring to FIG. 1F, after the sensing device A is bonded to the circuit board 260, the cover plate 170 and the temporary adhesive layer 165 of the sensing device A are removed from the substrate 100. As a result, the conducting pads 140, the sensing or device region 110, and the optical element 150 are exposed.

Afterwards, an optical component is provided on the circuit board 260. The optical component comprises a holder 270, a filter 280 and a lens 290. The holder 270 has containing space, so that the filter 280 and the lens 290 are disposed within the space of the holder 270 and are fixed to the holder 270. Next, the optical component corresponds to the sensing device A and is mounted onto the circuit board 260. As a result, the sensing device A on the circuit board 260 is also accommodated in the space of the holder 270. The filter 280 is located between the lens 290 and the first surface 100a of the substrate 100. Therefore, the photosensitive module 300 is fabricated.

In some embodiments, the circuit board 260 may be a panelized PCB or a de-panel board. When the circuit board 260 is a panelized PCB, the circuit board 260 can optionally be cut into de-panel boards after the optical component is mounted on the circuit board 260.

In some embodiments, the filter 280 needs to be spaced apart from the sensing or device region 110 by an appropriate distance, so the photosensitive module can provide good image quality. In some embodiments, the filter 280 is formed of a light-transmissive material (such as glass) and a filter layer thereon. Furthermore, the lens 290 can be formed of a single lens set or comprise multiple lens sets. To simplify the diagram, only a flat filter 280 and a flat lens 290 are depicted herein. The structure of the optical component is determined by design requirements and is not limited thereto.

Another exemplary embodiment of a method for forming a photosensitive module according to the invention is illustrated in FIGS. 2A to 2F, in which FIGS. 2A to 2F are cross-sectional views of another exemplary embodiment of a method for forming a photosensitive module 400 according to the invention. Elements in FIGS. 2A to 2F that are the same as those in FIGS. 1A to 1F are labeled with the same reference numbers as in FIGS. 1A to 1F and are not described again for brevity.

Figure 2A:
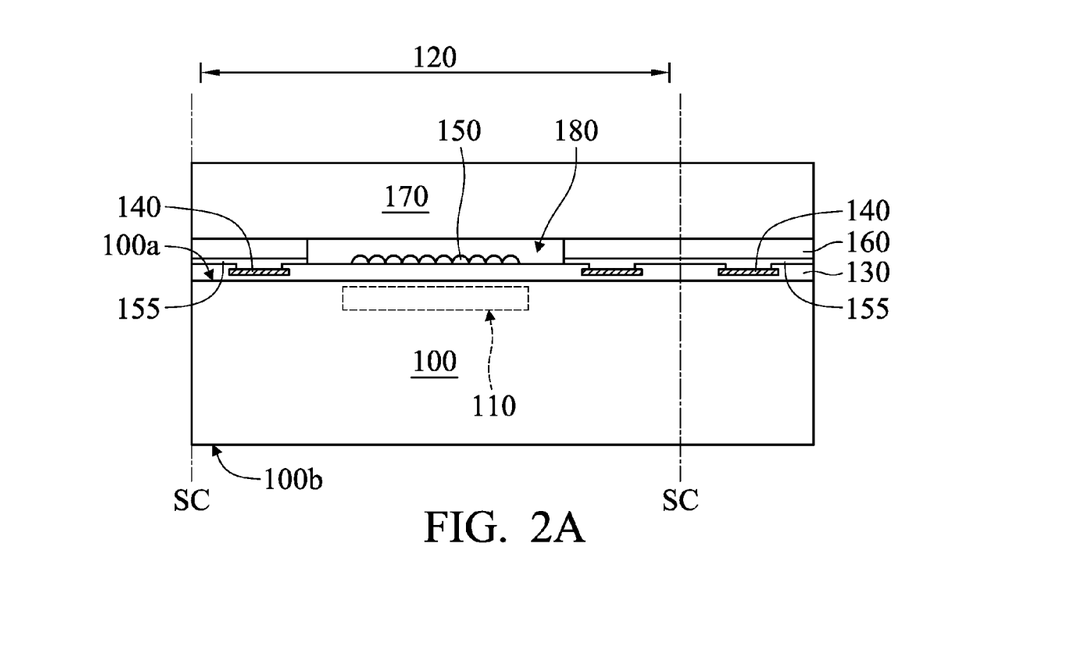
FIGS. 2A to 2F are cross-sectional views of another exemplary embodiment of a method for forming a photosensitive module according to the invention.

Referring to FIG. 2A, a substrate 100 is provided. The substrate 100 has a first surface 100a and a second surface 100b opposite thereto, and comprises multiple chip regions 120. To simplify the diagram, only a complete chip region and a partial chip region adjacent thereto are depicted herein.

There is an insulating layer 130 on the first surface 100a of the substrate 100. In general, the insulating layer 130 may be made of an ILD layer, IMD layers and a covering passivation layer. To simplify the diagram, only a single insulating layer 130 is depicted herein.

In some embodiments, one or more conducting pads 140 are located in the insulating layer 130 in each of the chip regions 120. In some embodiments, the insulating layer 130 in each of the chip regions 120 comprises one or more openings exposing the corresponding conducting pads 140 so as to perform a pre-test through the exposed conducting pads 140.

In some embodiments, a sensing or device region 110 is located in each of the chip regions 120. The sensing or device region 110 may be adjacent to the first surface 100a of the substrate 100, and may be electrically connected to the conducting pads 140 through interconnection structures (not shown). Moreover, the sensing or device region 110 may comprise an image sensing element. In some embodiments, each of the chip regions 120 comprises an optical element 150 disposed on the first surface 100a of the substrate 100 and corresponding to the sensing or device region 110.

Afterwards, a spacer layer 160 may be formed on the insulating layer 130 by a deposition process (such as a coating process, a physical vapor deposition process, a chemical vapor deposition process or another suitable process). A surfactant layer 155 may optionally be added between the spacer layer 160 and the insulating layer 130 and/or between the spacer layer 160 and the substrate 100. The surfactant layer 155 comprises a suitable material facilitating subsequent separation of the spacer layer 160 from the insulating layer 130 and/or the substrate 100.

The spacer layer 160 and the surfactant layer 155 cover the conducting pads 140, and expose the sensing or device region 110 and the optical element 150. In some embodiments, the spacer layer 160 does not substantially absorb moisture. In some embodiments, the spacer layer 160 may be adhesive and may contact none of the adhesive glue, thereby assuring that the spacer layer 160 will not move due to the disposition of the adhesive glue. Furthermore, since the adhesive glue is not needed, the sensing device can be prevented from being contaminated by the overflow of the adhesive glue.

In some embodiments, the spacer layer 160 may comprise epoxy resin, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates) or another suitable insulating material. In some other embodiments, the spacer layer 160 may comprise a photoresist material, and may be patterned by exposure and developing processes to expose the sensing or device region 110 and the optical element 150.

Next, the substrate 100 is bonded to a cover plate 170, and the spacer layer 160 forms a cavity 180 between the substrate 100 and the cover plate 170 in each of the chip regions 120. As a result, the optical element 150 is located in the cavity 180, and the optical element 150 in the cavity 180 is protected by the cover plate 170. In some embodiments, the cover plate 170 may comprise glass or another suitable substrate material.

In some other embodiments, the spacer layer 160 and the surfactant layer 155 may have been formed previously on the cover plate 170. The substrate 100 is then bonded to the cover plate 170 through the spacer layer 160 and the surfactant layer 155 on the cover plate 170. In some embodiments, the spacer layer 160 may be formed on each of the substrate 100 and the cover plate 170, and the substrate 100 may be bonded to the cover plate 170 through the two spacer layers 160. In other embodiments, the spacer layer 160 may be non-adhesive, and there may be an adhesive layer between the spacer layer 160 and the substrate 100 and/or between the spacer layer 160 and the cover plate 170.

Figure 2B:
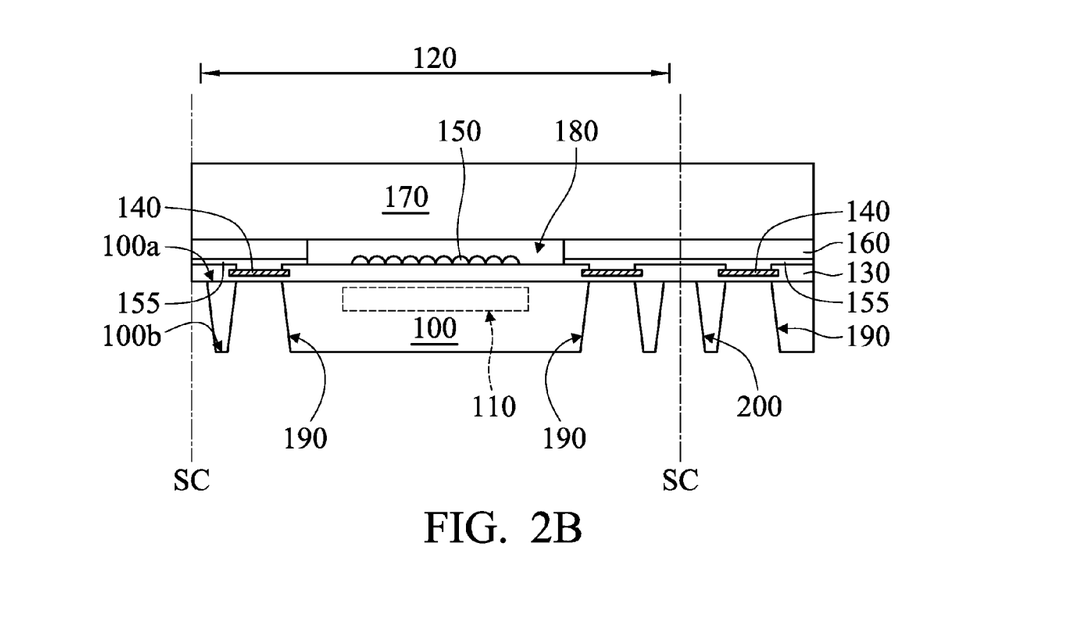

Referring to FIG. 2B, a thinning process using the cover plate 170 as a carrier substrate is performed on the second surface 100b of the substrate 100 so as to reduce the thickness of the substrate 100. Afterwards, multiple first openings 190 and a second opening 200 may be simultaneously formed in the substrate 100 in each of the chip regions 120 by a lithography process and an etching process. In other embodiments, the first openings 190 and the second opening 200 may be respectively formed by a notching process, and lithography and etching processes.

In some embodiments, the first openings 190 correspond to the conducting pads 140 and extend through the substrate 100. Moreover, the second opening 200 extends along scribed lines SC between the adjacent chip regions 120 and extends through the substrate 100. As a result, portions of the substrate 100 in the chip regions 120 are separated from each other. In other embodiments, the first openings 190 and the second opening 200 of the sensing device B as shown in FIG. 4 are in communication with each other. As a result, the end 220a of the redistribution layer 220 extends to the sidewall of the first opening 190, rather than extending on the second surface 100b of the substrate 100. For example, the end 220a of the redistribution layer 220 is located within the hole 240 in the first opening 190.

Figure 2C:
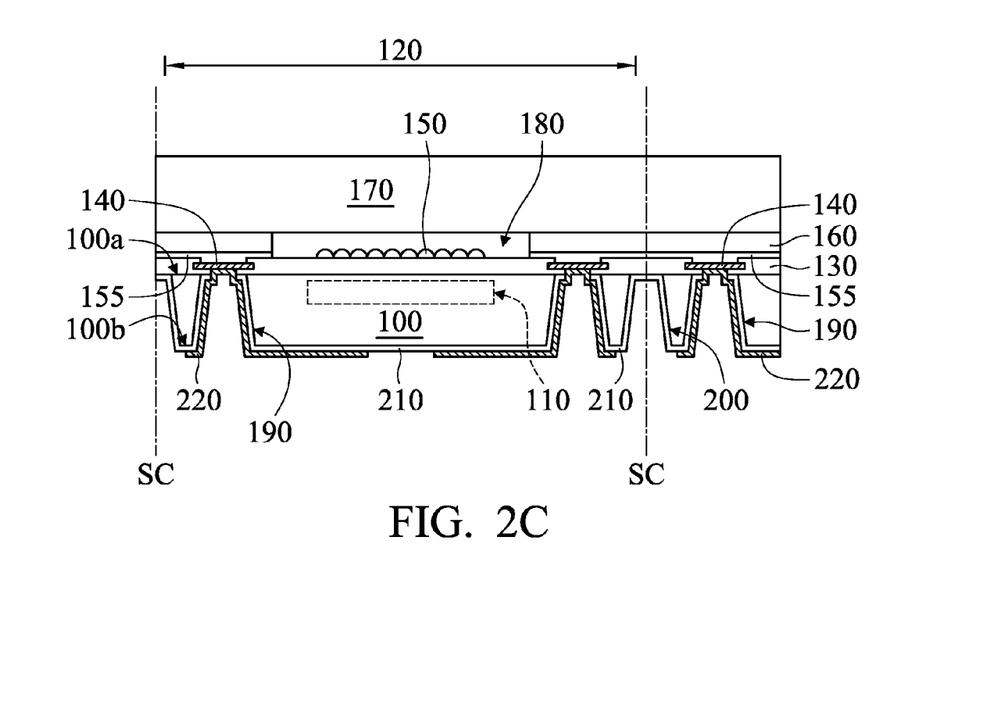

Referring to FIG. 2C, an insulating layer 210 may be formed on the second surface 100b of the substrate 100 by a deposition process. The insulating layer 210 fills the first openings 190 and the second opening 200. Afterwards, portions of the insulating layer 210 on the bottom of the first openings 190 and the underlying insulating layer 130 are removed by lithography and etching processes. As a result, the first openings 190 further extend into the insulating layer 130 and expose the corresponding conducting pads 140.

A patterned redistribution layer 220 is formed on the insulating layer 210 by deposition, lithography and etching processes. The redistribution layer 220 conformally extends to the sidewalls and the bottoms of the first openings 190 without extending into the second opening 200. The redistribution layer 220 is electrically isolated from the substrate 100 by the insulating layer 210. The redistribution layer 220 may be in direct electrical contact with or indirectly electrically connected to the exposed conducting pads 140 through the first openings 190. As a result, the redistribution layer 220 in the first openings 190 is also referred to as a TSV.

Figure 2D:
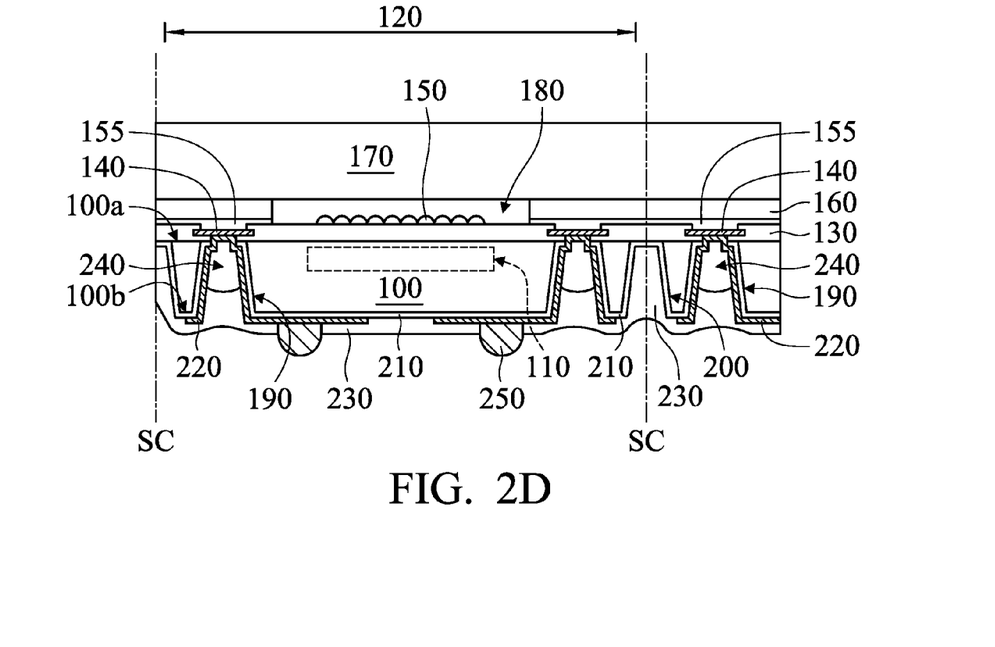

Referring to FIG. 2D, a protection layer 230 may be formed on the second surface 100b of the substrate 100 by a deposition process. The protection layer 230 fills the first openings 190 and the second opening 200 so as to cover the redistribution layer 220. In some embodiments, the first openings 190 are partially filled with the protection layer 230, so that a hole 240 is formed between the redistribution layer 220 and the protection layer 230 within the first openings 190. In some embodiments, the interface between the protection layer 230 and the hole 240 has an arcuate contour. In other embodiments, the first openings 190 may be completely filled with the protection layer 230.

Next, openings may be formed in the protection layer 230 on the second surface 100b of the substrate 100 by lithography and etching processes so as to expose portions of the redistribution layer 220. Subsequently, conducting structures 250 (such as solder balls, bumps or conductive pillars) may be filled in the openings of the protection layer 230 by a electroplating process, a screen printing process or another suitable process to electrically connect to the exposed redistribution layer 220.

Afterwards, the insulating layers 130 and 210, the protection layer 230, the temporary adhesive layer 165 and the cover plate 170 are diced along the scribed lines SC (equivalent to along the second opening 200). As a result, multiple separated chip packages (i.e., sensing devices A) are formed.

Figure 2E:
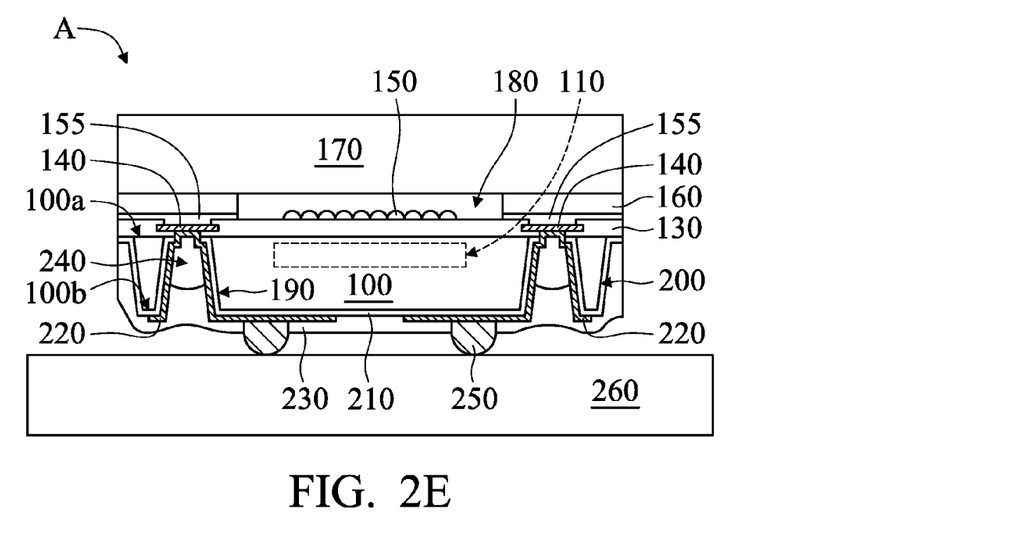

Referring to FIG. 2E, the sensing device A is bonded onto a circuit board 260. The sensing device A is electrically connected to the circuit board 260 through the conducting structures 250 on the second surface 100b of the substrate 100.

Figure 2F:
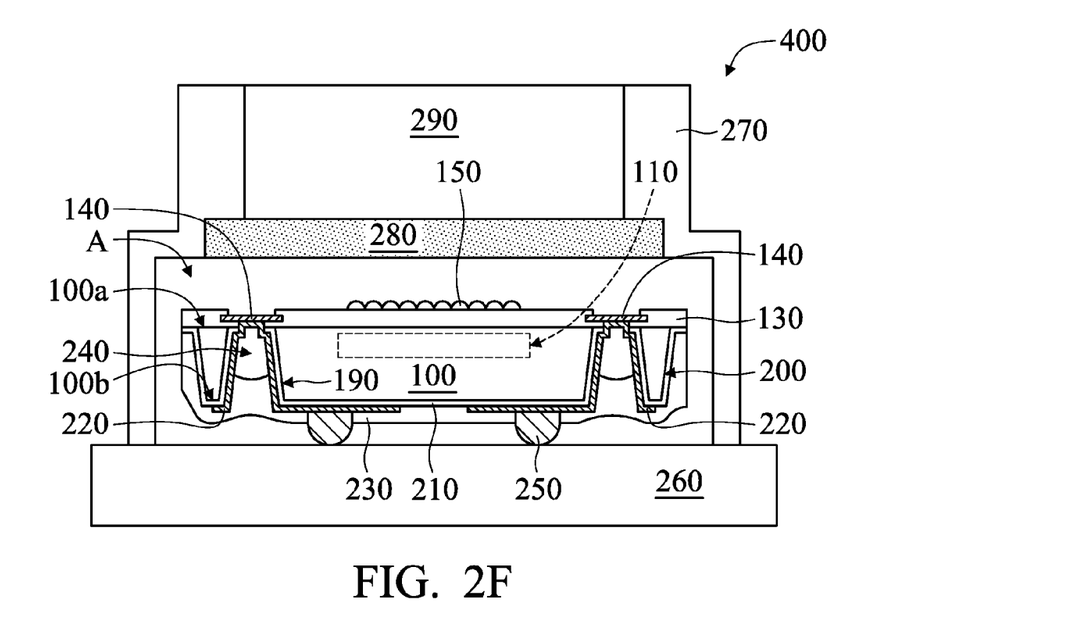

Referring to FIG. 2F, after the sensing device A is bonded to the circuit board 260, the cover plate 170 of the sensing device A is removed from the substrate 100. As a result, the optical element 150 is exposed. In some embodiments, since there is the surfactant layer 155 between the spacer layer 160 and the substrate 100 and between the spacer layer 160 and the insulating layer 130, the spacer layer 160 is also separated from the insulating layer 130 and the substrate 100 when the cover plate 170 is removed. The surfactant layer 155 makes it easier for the spacer layer 160 to be completely removed without remaining on the insulating layer 130 and the substrate 100.

In some other embodiments, the surfactant layer 155 may optionally be formed between the spacer layer 160 and the cover plate 170. In this case, the surfactant layer 155 comprises a suitable material facilitating subsequent separation of the spacer layer 160 from the cover plate 170. As a result, when the cover plate 170 is removed, the spacer layer 160 remains on the insulating layer 130 and the substrate 100 as shown in FIG. 4.

In other embodiments, if the spacer layer 160 is in direct contact with the insulating layer 130 and the cover plate 170 without a surfactant layer therebetween, the spacer layer 160 may be optionally remains on the insulating layer 130 and the substrate 100 as shown in FIG. 4. In addition, the spacer layer 160 may comprise a removable material. Therefore, the partial or entire spacer layer 160 may be removed.

According to the aforementioned embodiments, the surfactant layer 155 may be optionally formed between the cover plate 170 and the first surface 100a of the substrate 100 according to design requirements. For example, the surfactant layer 155 may be disposed between the spacer layer 160 and the first surface 100a of the substrate 100, and the spacer layer 160 is subsequently removed. Alternatively, the surfactant layer 155 may be disposed between the spacer layer 160 and the cover plate 170, and the spacer layer 160 remains permanently.

Afterwards, an optical component is provided on the circuit board 260. The optical component comprises a holder 270, a filter 280 and a lens 290. The holder 270 has containing space, so that the filter 280 and the lens 290 are disposed within the space of the holder 270 and are fixed to the holder 270. Next, the optical component corresponds to the sensing device A and is mounted onto the circuit board 260. As a result, the sensing device A on the circuit board 260 is also accommodated in the space of the holder 270. The filter 280 is located between the lens 290 and the first surface 100a of the substrate 100. Therefore, the photosensitive module 400 is fabricated. In some embodiments, the structure of the photosensitive module 400 may be the same as or similar to that of the photosensitive module 300.

Yet another exemplary embodiment of a method for forming a photosensitive module according to the invention is illustrated in FIGS. 3A to 3B, in which FIGS. 3A to 3B are cross-sectional views of yet another exemplary embodiment of a method for forming a photosensitive module 500 according to the invention. Elements in FIGS. 3A to 3B that are the same as those in FIGS. 1A to 1F and FIGS. 2A to 2F are labeled with the same reference numbers as in FIGS. 1A to 1F and FIGS. 2A to 2F and are not described again for brevity.

Referring to FIG. 3A, a sensing device A may be formed by steps that are the same as or similar to the steps shown in FIGS. 1A to 1D. The sensing device A may be bonded onto a circuit board 260 by steps that are the same as or similar to the steps shown in FIG. 1E. Afterwards, after the sensing device A is bonded to the circuit board 260, the cover plate 170 and the temporary adhesive layer 165 of the sensing device A are removed from the substrate 100. As a result, the conducting pads 140 and the optical element 150 are exposed.

In some other embodiments, a sensing device A may be formed by steps that are the same as or similar to the steps shown in FIGS. 2A to 2D. The sensing device A may be bonded onto a circuit board 260 by steps that are the same as or similar to the steps shown in FIG. 2E. Afterwards, after the sensing device A is bonded to the circuit board 260, the cover plate 170 and the spacer layer 160 of the sensing device A are removed from the substrate 100 through the surfactant layer 155. As a result, the conducting pads 140 and the optical element 150 are exposed.

Next, a bracket 510 having containing space is provided. A filter 280 is disposed within the space of the bracket 510 and is fixed to the bracket 510. The bracket 510 is mounted on the circuit board 260. As a result, the sensing device A on the circuit board 260 is also accommodated in the space of the bracket 510, and the filter 280 corresponds to the sensing or device region 110 and the optical element 150.

Subsequently, an actuator 520 and a lens 290 disposed therein are provided. In some embodiments, the actuator 520 may comprise a voice coil motor, an ultrasonic motor, a stepping motor, or another suitable actuator so as to provide automatic zoom functions. Afterwards, the actuator 520 and the lens 290 are mounted on the bracket 510 on the circuit board 260. The lens 290 corresponds to the sensing or device region 110 and the optical element 150. As a result, the filter 280 is located between the lens 290 and the sensing device A. Therefore, the photosensitive module 500 is fabricated.

In some embodiments, after mounting the bracket 510 and the filter 280 on the circuit board 260 and before mounting the actuator 520 and the lens 290 on the bracket 510, an initial test may have been performed previously so as to test the image quality sensed by the sensing device A. The actuator 520 and the lens 290 are subsequently mounted. Accordingly, it helps ensure the reliability of the photosensitive module, and reduce the fabrication cost.

In addition, the embodiment of FIGS. 3A to 3B can also be implemented to the embodiments of FIGS. 1A to 1F and FIGS. 2A to 2F. For example, the steps shown in FIG. 1F can be replaced by steps that are the same as or similar to the steps shown in FIGS. 3A to 3B. As a result, the photosensitive module 300 with the sensing device A has automatic zoom functions and becomes a zoom device.

It should be noted that although the embodiments of FIGS. 1A to 1F, and FIGS. 2A to 2F provide a method for forming a photosensitive module with a FSI sensing device, the method for forming external electrical connection paths (such as the opening in the substrate, the redistribution layer, the protection layer, or the conducting structures therein) can be implemented to the processes of a BSI sensing device.

In general, it is necessary to press a die in order to successfully attach it onto a PCB, using COB technology. Accordingly, the die should have a certain thickness (such as about 250 µm), in order to avoid causing physical damage during attachment.

According to the aforementioned embodiments, the sensing device is placed softly on the circuit board 260 during the process (such as a reflow process) for bonding the sensing device on the circuit board 260. Therefore, the thickness of the substrate in the sensing device can be further reduced without occurring crack or damage problems in the substrate, thereby facilitating the shrinkage of the overall size of the photosensitive module.

Moreover, the cover plate 170 is used to provide support and protection during the fabrication of the sensing device. During the reflow process, the sensing device (especially the sensing or device region 110 and the optical element 150) can be prevented from being contaminated by the cover plate 170, thereby improving the quality of the photosensitive module. Removing the cover plate 170 after bonding the sensing device to the circuit board 260 can facilitate reducing the overall height of the sensing device significantly, and increasing the light transmittance of the photosensitive modules. Furthermore, the cover plate 170 is only used as a temporary substrate and does not affect the sensing capability of the photosensitive module. Therefore, there is no need to use high-quality glass material as the cover plate 170 and an opaque substrate material may optionally be used.

In some embodiments, the sensing device is electrically connected to the circuit board 260 through the TSVs (i.e., the redistribution layer 220 in the first openings 190) without performing bonding wire processes to form wires. Accordingly, the fabrication cost is significantly lowered. In addition, wafer-level chip scale packaging (CSP) technology is used in the invention to form sensing devices of photosensitive modules. Massive sensing devices can be fabricated, thereby further reducing the cost and the fabrication time.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a photosensitive module, comprising:
   providing a sensing device, wherein the sensing device comprises:
      a substrate having a first surface and a second surface opposite thereto;
      a conducting pad on the first surface;
      a first opening penetrating the substrate and exposing the conducting pad;
      a redistribution layer in the first opening and electrically connected to the conducting pad;
      a cover plate on the first surface and covering the conducting pad;
      a spacer layer between the cover plate and the first surface and covering the conducting pad, and wherein the method further comprises removing the spacer layer and exposing the conducting pad after bonding the sensing device to the circuit board; and
      a surfactant layer between the cover plate and the first surface, and the spacer layer is removed through the surfactant layer;
   bonding the sensing device to a circuit board;
   removing the cover plate of the sensing device after bonding the sensing device to the circuit board; and
   mounting an optical component on the circuit board, wherein the optical component corresponds to the sensing device.

2. The method as claimed in claim 1, wherein the sensing device further comprises a temporary adhesive layer between the cover plate and the first surface and covering the conducting pad, and wherein the method further comprises removing the temporary adhesive layer after bonding the sensing device to the circuit board.

3. The method as claimed in claim 1, wherein the sensing device further comprises a spacer layer between the cover plate and the first surface and covering the conducting pad, and wherein the spacer layer is exposed after removing the cover plate.

4. The method as claimed in claim 3, wherein the sensing device further comprises a surfactant layer between the cover plate and the first surface, and the cover plate is removed through the surfactant layer.

5. The method as claimed in claim 1, further comprising forming a conducting structure electrically connected to the redistribution layer and between the redistribution layer and the circuit board.

6. The method as claimed in claim 5, wherein the step of bonding the sensing device to the circuit board comprises performing a reflow process.

7. The method as claimed in claim 1, wherein the sensing device further comprises a second opening extending along a sidewall of the substrate and penetrating the substrate.

8. The method as claimed in claim 7, wherein a method for forming the sensing device comprises dicing the cover plate along the second opening.

9. The method as claimed in claim 7, wherein the first opening is in communication with the second opening.

10. The method as claimed in claim 7, further comprising forming a protection layer, wherein the protection layer fills the first opening and the second opening.

11. A method for forming a photosensitive module, comprising:
    providing a sensing device, wherein the sensing device comprises:
       a substrate having a first surface and a second surface opposite thereto;
       a conducting pad on the first surface;
       a first opening penetrating the substrate and exposing the conducting pad;
       a redistribution layer in the first opening and electrically connected to the conducting pad; and
       a cover plate on the first surface and covering the conducting pad;
    bonding the sensing device to a circuit board;
    removing the cover plate of the sensing device after bonding the sensing device to the circuit board;
    mounting an optical component on the circuit board, wherein the optical component corresponds to the sensing device; and
    forming a protection layer, wherein the protection layer partially fills the first opening so that a hole is formed between the redistribution layer and the protection layer within the first opening.

12. The method as claimed in claim 11, wherein the redistribution layer has an end located within the hole.

13. The method as claimed in claim 11, wherein the sensing device further comprises a temporary adhesive layer between the cover plate and the first surface and covering the conducting pad, and wherein the method further comprises removing the temporary adhesive layer after bonding the sensing device to the circuit board.

14. The method as claimed in claim 11, wherein the sensing device further comprises a spacer layer between the cover plate and the first surface and covering the conducting pad, and wherein the spacer layer is exposed after removing the cover plate.

15. The method as claimed in claim 14, wherein the sensing device further comprises a surfactant layer between the cover plate and the first surface, and the cover plate is removed through the surfactant layer.

16. The method as claimed in claim 11, further comprising forming a conducting structure electrically connected to the redistribution layer and between the redistribution layer and the circuit board.

17. The method as claimed in claim 16, wherein the step of bonding the sensing device to the circuit board comprises performing a reflow process.

18. The method as claimed in claim 11, wherein the sensing device further comprises a second opening extending along a sidewall of the substrate and penetrating the substrate.

19. The method as claimed in claim 18, wherein a method for forming the sensing device comprises dicing the cover plate along the second opening.

20. The method as claimed in claim 18, wherein the first opening is in communication with the second opening.

* * * * *